United States Patent [19]

Kuwana

[11] Patent Number: 5,304,851
[45] Date of Patent: Apr. 19, 1994

[54] VOLTAGE DIVIDING CIRCUIT CAPABLE OF FREELY DIVIDING VOLTAGE

[75] Inventor: Kiyohisa Kuwana, Yokohama, Japan

[73] Assignee: Kabushiki Kaisha Toshiba, Kawasaki, Japan

[21] Appl. No.: 837,959

[22] Filed: Feb. 20, 1992

[30] Foreign Application Priority Data

Feb. 22, 1991 [JP] Japan ................................. 3-028795

[51] Int. Cl.$^5$ .............................................. H01H 9/00
[52] U.S. Cl. .................................... 307/113; 307/116; 307/125
[58] Field of Search ............... 307/112, 113, 115, 116, 307/125, 132 R, 132 E, 139, 140

[56] References Cited

U.S. PATENT DOCUMENTS

| | | |
|---|---|---|
| 3,693,047 | 9/1972 | Hamstra .............................. 361/113 |
| 3,973,135 | 8/1976 | Scott .................................... 307/141 |
| 5,070,252 | 12/1991 | Castenschiold et al. .............. 307/64 |

Primary Examiner—Jeffrey A. Gaffin
Attorney, Agent, or Firm—Oblon, Spivak, McClelland, Maier & Neustadt

[57] ABSTRACT

A plurality of resistors are series-connected between a first terminal to which a power source potential is applied and a second terminal to which a ground potential is applied. The plurality of resistors have such plane patterns that the current conduction paths thereof are arranged in parallel to one another. Switches of a first group for changing a connection between the plurality of resistors and an output terminal are respectively connected between the plurality of resistors and the output terminal. Switches of a second group for changing a connection between the plurality of resistors and the second terminal are respectively connected between the plurality of resistors and the second terminal. The conduction states of the switches of the first group are controlled by an output signal of a first control circuit and the conduction states of the switches of the second group are controlled by an output signal of a second control circuit.

23 Claims, 5 Drawing Sheets

VOLTAGE DIVIDING CIRCUIT CAPABLE OF FREELY DIVIDING VOLTAGE

BACKGROUND OF THE INVENTION

1. Field of the Invention

This invention relates to a voltage dividing circuit and more particularly to a voltage dividing circuit capable of freely dividing a voltage as required and suitably used for a digital-analog converter or analog-digital converter, for example.

2. Description of the Related Art

In general, a voltage dividing circuit includes a plurality of resistors connected in series. The resistors are serially connected between terminals across which a voltage to be divided is applied. A desired divided voltage is derived from one of connection nodes between the resistors by adequately setting the number of the resistors and dividing each of the resistors into small resistance segments. The voltage can be divided with a small voltage step by increasing the number of the resistors and dividing each of the resistors into small resistance segments. However, there occurs a defect that the number of voltage divisions and the voltage step are previously determined by the number of the resistors and the resistances thereof. When each of the resistor is divided into small resistance segments, the pattern area may be increased and a multi-layered wiring will be required. Further, when the voltage is divided with a small voltage step, the output voltage level tends to be influenced by variation in the resistance caused in the manufacturing process of the resistors and will cause noises if the voltage dividing circuit is used in a D/A converter.

As a voltage dividing circuit capable of permitting selection of the number of voltage divisions, the circuit construction shown in FIG. 1 is known, for example. The voltage dividing circuit includes n resistors R1 to Rn, switches SW1 to SWn and a control circuit 11. The resistors R1 to Rn are serially connected between a terminal 12-1 to which a power source potential $V_{DD}$ is applied and a terminal 12-2 to which a ground potential $V_{SS}$ is applied (a group of series-connected resistors is called a "resistor string"). The switch SW1 is connected between one end N1 of the resistor R1 and an output terminal 13. Each of the switches SW2 to SWn is connected between a corresponding one of connection nodes N2 to Nn of the resistors R1 to Rn and the output terminal 13. The switching positions or ON/OFF positions of the switches SW1 to SWn are selectively controlled by an output signal of the control circuit 11. A voltage derived by dividing the voltage applied between the terminals 12-1 and 12-2 by a number selected according to the ON/OF positions of the switches SW1 to SWn is output from the output terminal 13. When the resistances of the resistors R1 to Rn are set equal to one another and the switches SW1 to SWn are sequentially turned on one at a time, one of output voltages $V_{OUT}$ corresponding to 1/n, 2/n, - - -, and (n−1)/n times a difference between the ground potential $V_{SS}$ and power source potential $V_{DD}$ is sequentially obtained. That is, the output voltage $V_{OUT}$ is a voltage derived by multiplying the voltage applied between the terminals 12-1 and 12-2 by X/n (X=1, 2, 3, - - -, or n−1).

In the circuit construction shown in FIG. 1, a voltage derived by selectively dividing the voltage applied between the terminals 12-1 and 12-2 by use of the switches SW1 to SWn can be output. However, since the resistance of the resistors R1 to Rn are previously determined at the stage of design, an output voltage $V_{OUT}$ having a desired voltage ratio which is not determined at the design stage cannot be obtained after the circuit is formed. The voltage dividing circuit of FIG. 1 is disadvantageous in another aspect. If each resistor is divided into more segments, the output voltage of the circuit tends to change due to the difference in resistance among the resistors, which has inevitably occurred during the manufacturing of these resistors, and also due to the fluctuation in the power-source voltage. A change in the output voltage, if any, will lower the resolution of the voltage dividing circuit. Instead of dividing each resistor into more segments, more resistors can be used to form the voltage dividing circuit. Obviously, this method increases the size of the voltage dividing circuit and, hence, the manufacturing cost thereof.

SUMMARY OF THE INVENTION

Accordingly, an object of this invention is to provide a voltage dividing circuit capable of outputting a voltage which is freely divided even after a circuit construction is completed.

Another object of this invention is to provide a voltage dividing circuit having a high resolution.

Still another object of this invention is to provide a voltage dividing circuit capable of permitting the size of a device to which this voltage dividing circuit is applied to be reduced and the cost thereof to be lowered.

The above objects can be attained by a voltage dividing circuit comprising a plurality of resistors series-connected between first and second terminals between which a voltage to be divided is applied, and having such plane patterns that current conduction paths thereof are set in parallel to one another; first switching means connected between at least one of connection nodes of the plurality of resistors and an output terminal, for selectively changing a connection between the plurality of resistors and the output terminal; and second switching means connected between at least one of connection nodes of the plurality of resistors and the second terminal, for selectively changing a connection between the plurality of resistors and the second terminal.

With the above construction, even if the resistances of the resistors are previously determined at the design stage, the voltage applied between the first and second terminals can be freely divided in the division ratio of 1/n to (n−1)/n, 1/(n−1) to (n−2)/(n−1), 1/(n−2) to (n−3)/(n−2), - - -, and 1/2 according to the selection states of the first and second switching means when the number of the resistors is n. Further, since the number of voltage divisions can be increased without increasing the number of the resistors, deterioration of the resolution can be suppressed, the size of a semiconductor device to which this resistance type voltage dividing circuit is applied can be reduced and the cost thereof can be lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Figure 1:
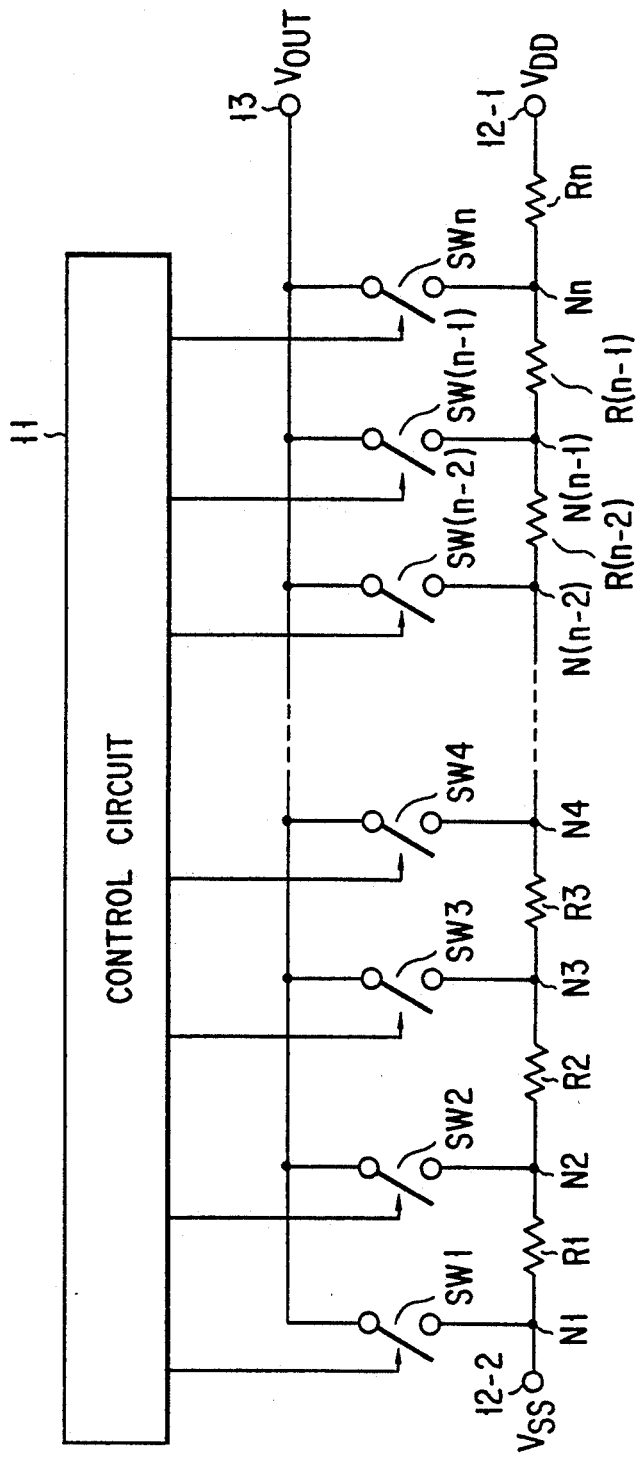
FIG. 1 is a circuit diagram showing a conventional voltage dividing circuit.
Figure 2:
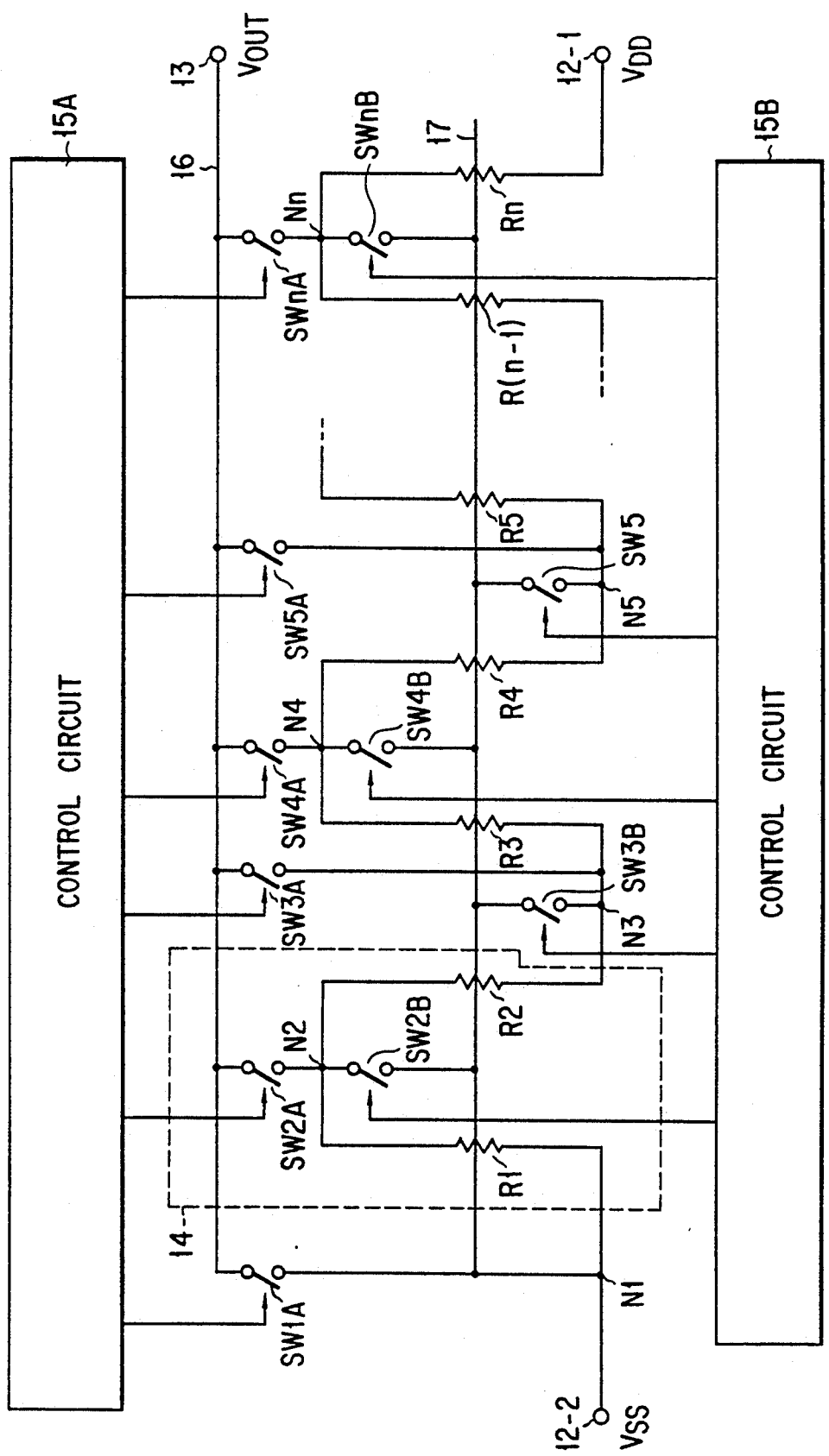
FIG. 2 is a circuit diagram showing a voltage dividing circuit according to a first embodiment of this invention.

There will now be described a first embodiment of this invention with reference to FIGS. 2 and 3A to 3D. FIG. 2 is a circuit diagram of the voltage dividing circuit, FIG. 3A is pattern plan view of a region surrounded by broken lines 14 of FIG. 2, and FIGS. 3B to 3D are cross sectional views taken along the 3B—3B, 3C—3C and 3D—3D lines of FIG. 3A.

As shown in FIG. 2, the voltage dividing circuit includes resistors R1 to Rn (n is a positive integer larger than 1), a first group of switches SW1A to SWnA, a second group of switches SW2B to SWnB, a first control circuit 15A, and a second control circuit 15B. The resistors R1 to Rn are serially connected between a terminal 12-1 to which a power source potential $V_{DD}$ (first reference potential) is applied and a terminal 12-2 to which a ground potential $V_{SS}$ (second reference potential) is applied. The switch SW1A is connected between one end N1 (terminal 12-2) of the resistor R1 and an output line 16 connected to an output terminal 13. One-side ends of the switches SW2A to SWnA are respectively connected to connection nodes N2, N3, ---, and Nn between the resistors R1 and R2, the resistors R2 and R3, ---, and the resistors R(n−1) and Rn (all of the connection nodes are not necessarily used) and the other ends thereof are connected to the output line 16. One-side ends of the switches SW2B to SWnB are respectively connected to the connection nodes N2, N3, ---, and Nn and the other ends thereof are connected to a ground line 17 which is connected to the terminal 12-2. The ground line 17 is formed over the resistors R1 to Rn and electrically isolated from the resistors R1 to Rn. The ON/OFF positions of the switches SW1A to SW1n are selectively controlled by an output of the first control circuit 15A and the ON/OFF positions of the switches SW2B to SW2n are selectively controlled by an output of the second control circuit 15B. A divided output voltage $V_{OUT}$ is derived from the output terminal 13.

Figure 3A:
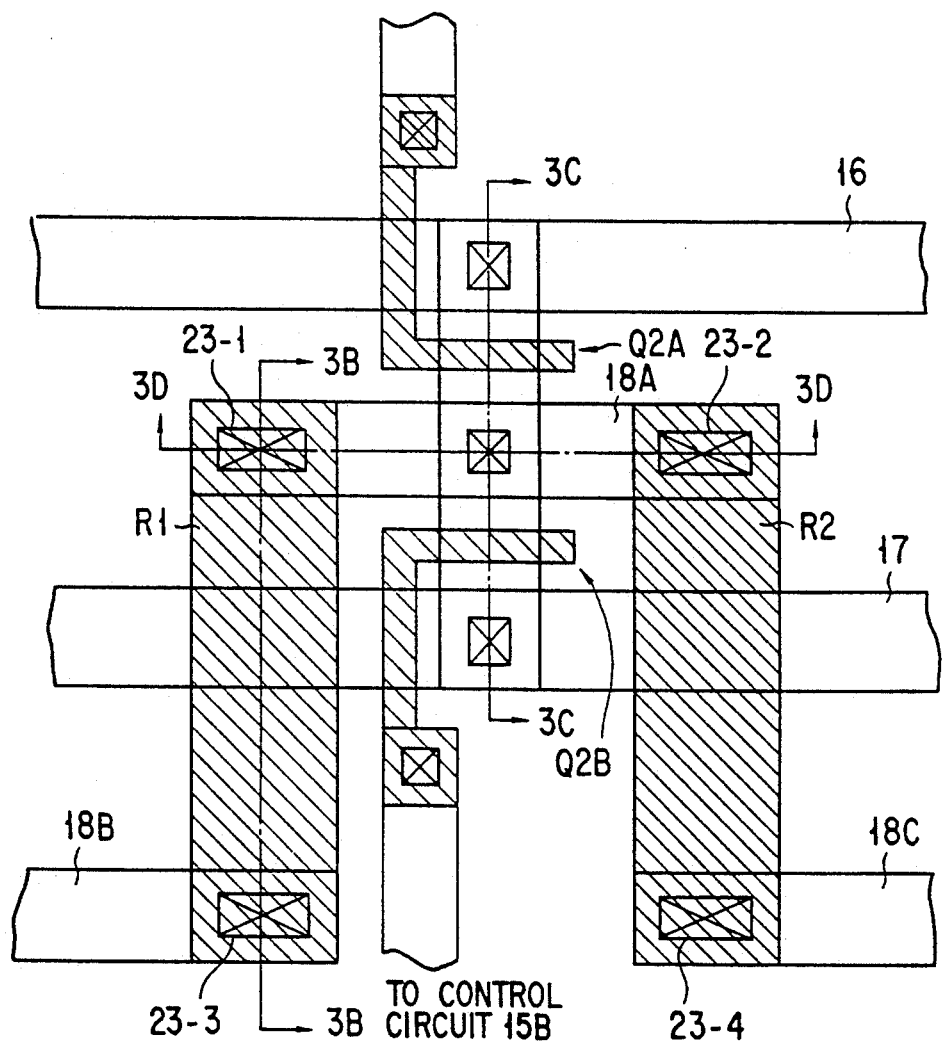
FIG. 3A is a pattern plan view showing an extracted portion of the voltage dividing circuit shown in FIG. 2.
Figure 3B:
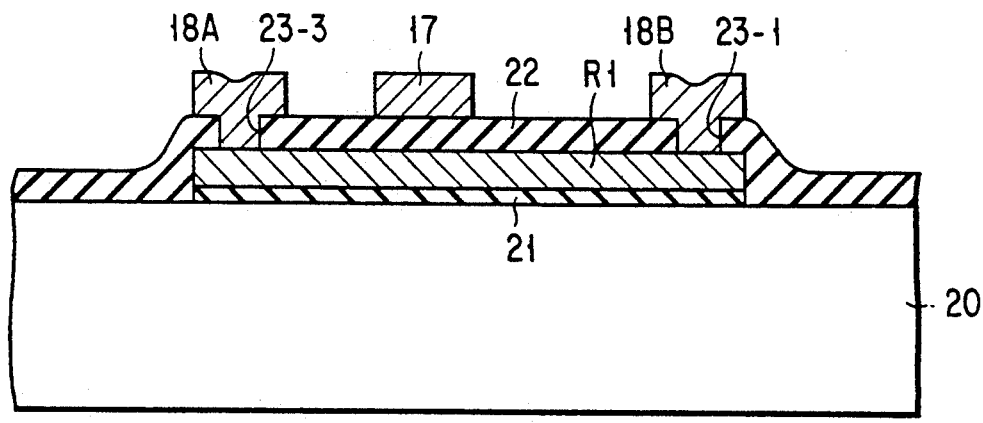
FIG. 3B is a cross sectional view of the pattern taken along the 3B—3B line of FIG. 3A.

The resistors R1 to Rn are formed of polysilicon layers which are arranged in parallel (whose current conduction paths are set in parallel) as is typically shown by the resistors R1 and R2 in FIG. 3A. As shown in FIG. 3B, the polysilicon layer (resistor R1, R2) is formed on an insulative layer 21 formed on a semiconductor substrate 20. An insulative layer 22 is formed on the polysilicon layer and the semiconductor substrate 20. The ground line 17 formed of an aluminum layer, for example, and disposed to extend in a direction to cross the current conduction paths of the resistors R1 and R2 at right angles is formed on the insulative layer 22. As shown in FIG. 3D, contact holes 23-1 and 23-2 are formed in portions of the insulative layer 22 which lie on one-side ends of the resistors R1 and R2. A wiring layer 18A formed of aluminum, for example, is formed on the insulative layer 22 and the one-side ends of the resistors R1 and R2 are electrically connected to each other via the contact holes 23-1 and 23-2 and the wiring layer 18A. A contact hole 23-3 is formed in part of the insulative layer 22 which lies on the other end of the resistor R1. A wiring layer 18B of aluminum, for example, is formed on the insulative layer 22 and the other end of the resistor R1 is electrically connected to the terminal 12-2. A contact hole 23-4 is formed in part of the insulative layer 22 which lies on the other end of the resistor R2. A wiring layer 18C of aluminum, for example, is formed on the insulative layer 22 and the other end of the resistor R2 is electrically connected to one end of the resistor R3 shown in FIG. 2 via the wiring layer 18C.

Figure 3C:
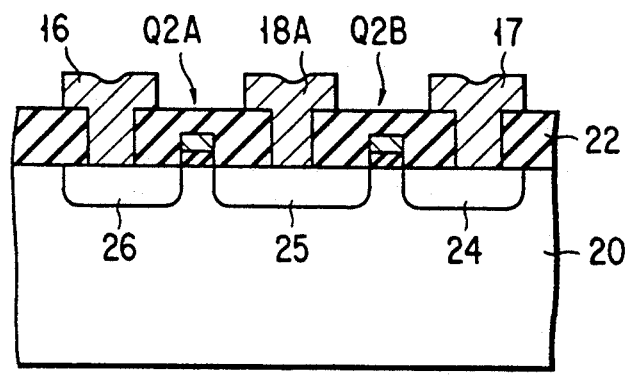
FIG. 3C is a cross sectional view of the pattern taken along the 3C—3C line of FIG. 3A.
Figure 3D:
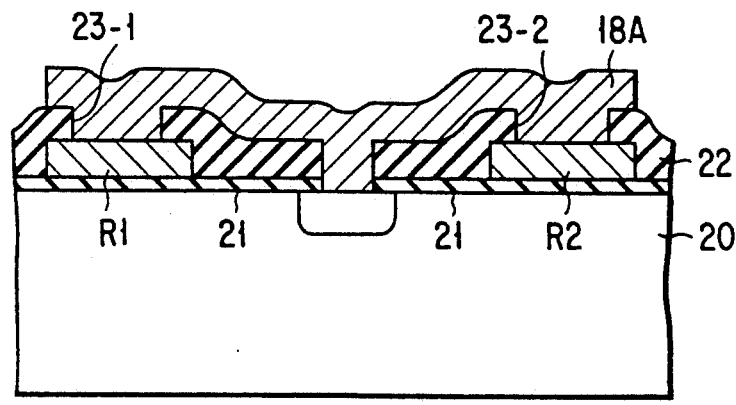
FIG. 3D is a cross sectional view of the pattern taken along the 3D—3D line of FIG. 3A.

As shown in FIG. 3C, the source region 24 of a MOSFET Q2B used as the switch SW2B is connected to the ground line 17 and the drain region 25 thereof is connected to the wiring layer 18A. As shown in FIG. 3A, the MOSFET Q2B is formed in a region between the resistors R1 and R2 and the conduction state thereof is controlled by an output signal of the control circuit 15B of FIG. 2. The drain region 25 (commonly used as the drain region of the MOSFET Q2B) of a MOSFET Q2A is connected to the wiring layer 18A and the source region 26 thereof is connected to the output line 16. The conduction state of the MOSFET Q2A is controlled by an output signal the control circuit 15A of FIG. 2.

By using the structure shown in FIGS. 3A to 3D as one basic unit, a plurality of basic units are arranged in a direction in which the ground line 17 is extended to constitute the resistor string of the voltage dividing circuit shown in FIG. 2.

The operation of the voltage dividing circuit with the above construction is explained below. In this case, the explanation is made on the assumption that the resistances of the resistors R1 to Rn are set to the same value. When all of the switches SW2B to SWnB are turned off by an output of the control circuit 15B and the switch SW2A is turned on and the switches SW2A to SWnA are turned off by an output of the control circuit 15A, an output voltage $V_{OUT}$ is set to $V_{SS}$ (0 V). In this state, if the switch SW1A is turned off and the switch SW2A is turned on, the output voltage $V_{OUT}$ is set to $V_{DD}/n$. When the switches SW1A, SW2A, SW4A to SWnA are turned off and the switch SW3A is turned on, the output voltage $V_{OUT}$ is set to $2V_{DD}/n$. Likewise, when only one of the switches SW4A to SWnA is sequentially turned on, the output voltage $V_{OUT}$ is sequentially set to a corresponding one of $3V_{DD}/n$ to $(n-1)V_{DD}/n$.

Next, when the switch SW2B is turned on and the switches SW3B to SWnB are turned off by an output of the control circuit 15B and the switch SW1A is turned on and the switches SW2A to SWnA are turned off by an output of the control circuit 15A, the output voltage $V_{OUT}$ is set to $V_{SS}$ (0 V). In this state, if the switch SW1A is turned off and the switch SW3A is turned on, the output voltage $V_{OUT}$ is set to $V_{DD}/(n-1)$. Likewise, when only one of the switches SW4A to SWnA is sequentially turned on, the output voltage $V_{OUT}$ is sequentially set to a corresponding one of $2V_{DD}/(n-1)$, $3V_{DD}/(n-1)$, - - -, and $(n-2)V_{DD}/(n-1)$.

When the switch SW3B is turned on and the switches SW2B, SW4B to SWnB are turned off by an output of the control circuit 15B and only one of the switches SW1A to SWnA is sequentially turned on by an output of the control circuit 15A, the output voltage $V_{OUT}$ is set to a corresponding one of $V_{SS}$ (0 V), $V_{DD}/(n-2)$, $2V_{DD}/(n-2)$, $3V_{DD}/(n-2)$, - - -, and $(n-3)V_{DD}/(n-2)$.

Likewise, when only one of the switches SW1A to SWnA is sequentially turned on while only one of the switches SW4B to SWnB is set in the ON state, a potential difference between the power source potentials $V_{DD}$ and $V_{SS}$ applied to the terminals 12-1 and 12-2 can be divided by $(n-3)$, $(n-4)$, - - -, or 2 and the output voltage $V_{OUT}$ can be set to a corresponding one of $\{V_{SS}, V_{DD}/(n-3), 2V_{DD}/(n-3), - - -,$ and $(n-4)V_{DD}/(n-3)\}$, $\{V_{SS}, V_{DD}/(n-4), 2V_{DD}/(n-4),$ - - -, and $(n-5)V_{DD}/(n-4)\}$, - - -, and $\{V_{SS}, V_{DD}/2\}$.

Thus, even if the resistances of the resistors R1 to Rn are previously determined at the design stage, the voltage applied between the terminals 12-1 and 12-2 can be freely divided by n to $n/(n-1)$, $(n-1)$ to $(n-1)/(n-2)$, $(n-2)$ to $(n-2)/(n-3)$, - - -, or 2 by selectively controlling controlling the conduction states of the switches SW1A to SWnA and SW2B to SWnB of the first and second groups.

Since the number of divisions can be increased without increasing the number of resistors, deterioration in the resolution can be suppressed, and the size of a device in which the resistance type voltage dividing circuit is incorporated can be reduced and the cost thereof can be lowered. Further, since n resistors R1 to Rn are arranged in parallel and MOSFETs serving as the switches SW2B to SWnB are respectively disposed between the resistors R1 and R2, the resistors R2 and R3, - - -, and the resistors R(n−1) and Rn so that the space can be effectively used on the pattern layout. Since the ground line 17 is arranged over the resistors R1 to Rn, the space can be further effectively used, thereby making it possible to reduce the chip size.

In the pattern structure shown in FIG. 3A, a power source line used for the control circuits 15A and 15B may be formed over the resistors R1 to Rn instead of the ground line 17.

When the above voltage dividing circuit is used as a D/A converter, a digital signal is supplied to the control circuits 15A and 15B so that the control circuit 15B may first sequentially select the switches SW2B to SWnB to derive a first output signal of (n−1) divisions, that is, a signal corresponding to one of divided voltages of $V_{DD}/(n-1)$ to $(n-2)V_{DD}/(n-1)$. Next, the control circuit 15A may sequentially select the switches SW1A to SWnA to derive a second output signal of n divisions, that is, a signal corresponding to one of divided voltages of $V_{DD}/n$ to $(n-2)V_{DD}/(n-1)$. After this, the first and second output signals are added together by an adder, for example, to derive an analog output voltage corresponding to $\{n+(n-1)\}$ bits.

Figure 4:
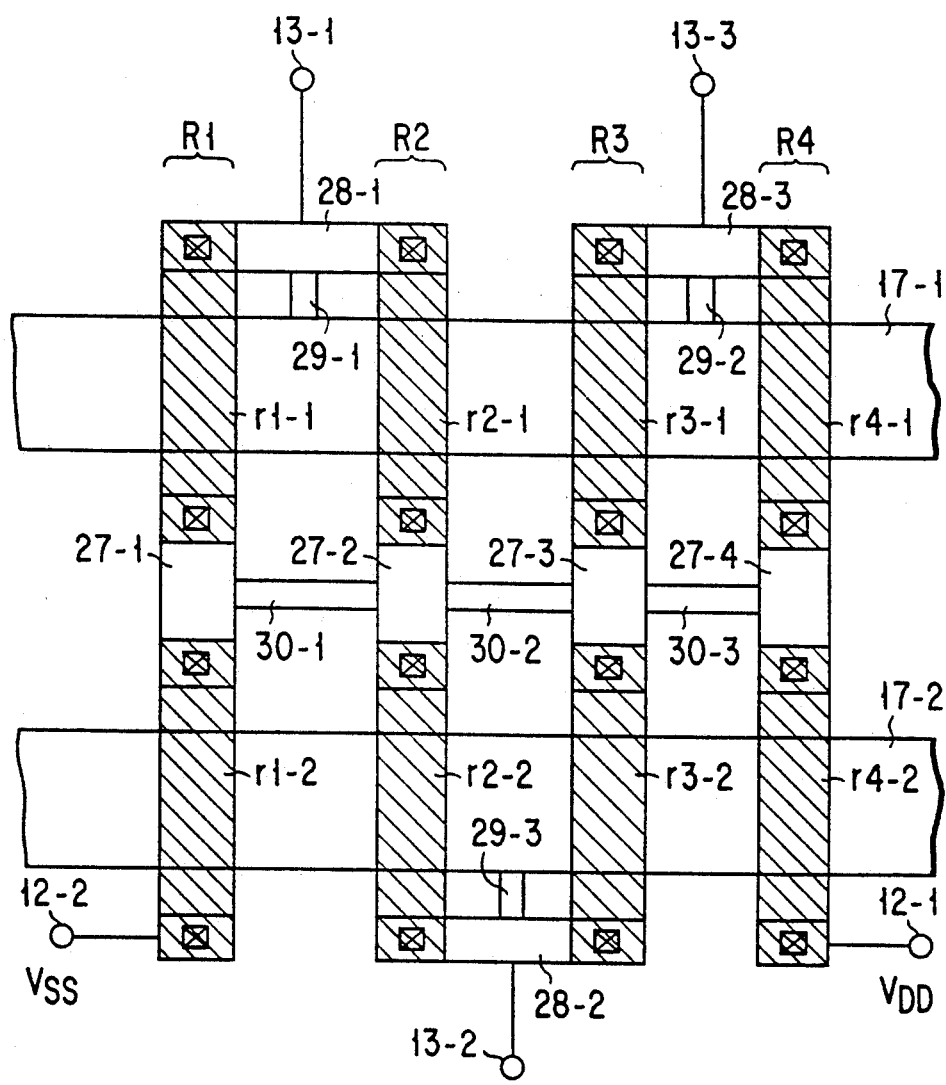
FIG. 4 is a pattern plan view for illustrating a voltage dividing circuit according to a second embodiment of this invention.

FIG. 4 is a pattern plan view showing a voltage dividing circuit according to a second embodiment of this invention. In the first embodiment, the first and second groups of switches and the first and second control circuits are used to control the voltage dividing operation, but in the second embodiment, fusible metal layers which can be fused by application of laser beam or the like are used. Resistors R1, R2, R3 and R4 are used as one resistance element and are arranged in parallel to one another (the current conduction paths thereof are arranged in parallel). The resistor R1 is formed by serially connecting resistance layers r1-1 and r1-2 via a wiring layer 27-1. Likewise, the resistor R2 is formed by serially connecting resistance layers r2-1 and r2-2 via a wiring layer 27-2, the resistor R3 is formed by serially connecting resistance layers r3-1 and r3-2 via a wiring layer 27-3, and the resistor R4 is formed by serially connecting resistance layers r4-1 and r4-2 via a wiring layer 27-4. A first ground line 17-1 (or a power source line may be used) is formed over the resistance layers r1-1 to r4-1 and electrically isolated from the resistance layers. The ground line 17-1 is formed to extend in a direction to cross the current conduction paths of the resistance layers r1-1 to r4-1 at right angles. A second ground line 17-2 (or a power source line may be used) is formed over the resistance layers r1-2 to r4-2 and electrically isolated from the resistance layers. The ground line 17-2 is formed to extend in a direction to cross the current conduction paths of the resistance layers r1-2 to r4-2 at right angles.

One end of the resistor R1 is connected to one end of the resistor R2 via a wiring layer 28-1, the other end of the resistor R2 is connected to one end of the resistor R3 via a wiring layer 28-2, and the other end of the resistor R3 is connected to one end of the resistor R4 via a wiring layer 28-3. The wiring layers 28-1 and 28-2 are connected to the ground line 17-1 via metal layers (for example, aluminum layers) 29-1 and 29-2 which can be fused by application of laser beam or the like and the wiring layer 28-3 is connected to the ground line 17-2 via a metal layer 29-3 which can be fused by application of laser beam or the like. The metal layers 29-1 to 29-3 are formed in a direction parallel to the current conduction paths of the resistances R1 to R4. The wiring layers 27-1 and 27-2 are connected to each other via a metal layer 30-1 which can be fused by application of laser beam or the like. Likewise, the wiring layers 27-2 and 27-3 and the wiring layers 27-3 and 27-4 are connected via metal layers 30-2 and 30-3, respectively. The metal layers 30-1 to 30-3 are formed in a direction parallel to the current conduction paths of the resistors R1 to R4.

With the above construction, it is possible to divide a voltage applied between the terminals 12-1 and 12-2 by a desired number and output the divided voltages from output terminals 13-1 to 13-3 by selectively cutting off the metal layers 29-1 to 29-3 and 30-1 to 30-3 by application of laser beam of the like as required after the pattern formation is completed. In the second embodiment, the voltage division is explained by use of the four resistors R1 to R4, but the number of resistors is limited to four and can be set to two or more than four. The resistors R1 to R4 are formed of the series-connected two resistance layers, but they may be formed by serially connecting three or more resistance layers.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A voltage dividing circuit comprising:
a plurality of resistors series-connected between first and second terminals between which a voltage to be divided is applied, having such plane patterns that current conduction paths thereof are set in parallel to one another;
first switching means connected between at least one of connection nodes of said plurality of resistors and an output terminal, for selectively changing a connection between said plurality of resistors and said output terminal, and for outputting the selectively connected node voltage to said output terminal; and
second switching means connected between at least one of connection nodes of said plurality of resistors and said second terminal, for selectively changing a connection between said plurality of resistors and said second terminal, and for changing a series resistance of resistors connected between first and second terminals.

2. A voltage dividing circuit according to claim 1, wherein said first terminal is applied with a first reference potential and said second terminal is applied with a second reference potential which is different from the first reference potential.

3. A voltage dividing circuit according to claim 1, further comprising one of a power source line and a ground line formed over said plurality of resistors, arranged to extend in a direction to cross the current conduction paths of said plurality of resistors and electrically isolated from said plurality of resistors.

4. A voltage dividing circuit according to claim 1, wherein said first switching means includes at least one first switch connected between at least one connection node of said plurality of resistors and said output terminal and said second switching means includes at least one second switch connected between at least one connection node of said plurality of resistors and said second terminal.

5. A voltage dividing circuit according to claim 4, further comprising first control means for controlling the conduction state of said at least one first switch and second control means for controlling the conduction state of said at least one second switch.

6. A voltage dividing circuit according to claim 4, wherein said at least one first switch and said at least one second switch include MOSFETs.

7. A voltage dividing circuit according to claim 6, wherein said MOSFETs are formed in areas provided between said plurality of resistors having current conduction paths set in parallel.

8. A voltage dividing circuit comprising:
a plurality of resistors series-connected between first and second terminals between which a voltage to be divided is applied, having such plane patterns that current conduction paths thereof are set in parallel to one another;
a wiring formed over said plurality of resistors, arranged to extend in a direction to cross the current conduction paths of said plurality of resistors and electrically isolated from said plurality of resistors, said wiring being applied with a constant potential; and
switching means connected between at least one of connection nodes of said plurality of resistors and said wiring, for selectively changing a connection between said plurality of resistors and said wiring.

9. A voltage dividing circuit according to claim 8, wherein said first terminal is applied with a first reference potential and said second terminal is applied with a second reference potential which is different from the first reference potential.

10. A voltage dividing circuit according to claim 8, wherein said wiring is applied with one of a power source potential and a ground potential.

11. A voltage dividing circuit according to claim 8, wherein said switching means includes first metal layers respectively connected between the connection nodes of said plurality of resistors and an output terminal, said first metal layers being selectively cut off.

12. A voltage dividing circuit according to claim 11, wherein said first metal layers are fused and cut off by application of laser beam.

13. A voltage dividing circuit according to claim 11, wherein each of said resistors is formed by series-connecting a plurality of resistive layers.

14. A voltage dividing circuit according to claim 13, wherein said resistive layers are connected by means of second metal layers and said first and second metal layers are selectively cut off.

15. A voltage dividing circuit according to claim 14, wherein said first and second metal layers are fused and cut off by application of laser beam.

16. A voltage dividing circuit comprising:
a plurality of resistors series-connected between first and second terminals between which a voltage to be divided is applied, having such plane patterns that current conduction paths thereof are set in parallel to one another;
a wiring formed over said plurality of resistors, arranged to extend in a direction to cross the current conduction paths of said plurality of resistors and electrically isolated from said plurality of resistors, said wiring being connected to one of said first and second terminals; and
switching means connected between at least one of connection nodes of said plurality of resistors and said wiring, for selectively changing a connection between said plurality of resistors and said wiring and for changing the combination of resistors connected between first and second terminals.

17. A voltage dividing circuit according to claim 16, wherein said first terminal is applied with a first reference potential and said second terminal is applied with a second reference potential which is different from the first reference potential.

18. A voltage dividing circuit according to claim 16, wherein said wiring is applied with one of a power source potential and a ground potential.

19. A voltage dividing circuit according to claim 16, wherein said switching means includes first metal layers respectively connected between the connection nodes of said plurality of resistors and an output terminal, said first metal layers being selectively cut off.

20. A voltage dividing circuit according to claim 19, wherein said first metal layers are fused and cut off by application of a laser beam.

21. A voltage dividing circuit according to claim 19, wherein each of said resistors is formed by series-connecting a plurality of resistive layers.

22. A voltage dividing circuit according to claim 21, wherein said resistive layers are connected by means of second metal layers and said first and second metal layers are selectively cut off.

23. A voltage dividing circuit according to claim 22, wherein said first and second metal layers are fused and cut off by application of a laser beam.

* * * * *